(12) United States Patent
Li et al.

(10) Patent No.: US 10,186,689 B2
(45) Date of Patent: Jan. 22, 2019

(54) ORGANIC LIGHT-EMITTING DISPLAY PANEL AND MANUFACTURING METHOD

(75) Inventors: Yanzhao Li, Beijing (CN); Gang Wang, Beijing (CN); Li Sun, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 185 days.

(21) Appl. No.: 13/700,480

(22) PCT Filed: Aug. 21, 2012

(86) PCT No.: PCT/CN2012/080422
§ 371 (c)(1),
(2), (4) Date: Jan. 23, 2013

(87) PCT Pub. No.: WO2013/056596
PCT Pub. Date: Apr. 25, 2013

(65) Prior Publication Data
US 2013/0112958 A1 May 9, 2013

(30) Foreign Application Priority Data

Oct. 17, 2011 (CN) .......................... 2011 1 0315177

(51) Int. Cl.
*H01L 51/56* (2006.01)
*H01L 51/50* (2006.01)
(Continued)

(52) U.S. Cl.
CPC .......... *H01L 51/56* (2013.01); *H01L 27/3211* (2013.01); *H01L 27/3244* (2013.01);
(Continued)

(58) Field of Classification Search
CPC ............... H01L 2227/323; H01L 51/56; H01L 51/0018; H01L 27/3211; H01L 27/3213;
(Continued)

(56) References Cited

U.S. PATENT DOCUMENTS 5,693,962 A * 12/1997 Shi et al. ......................... 257/89
6,146,715 A * 11/2000 Kim ..................... H01L 27/3211
216/17

(Continued)

FOREIGN PATENT DOCUMENTS

| CN | 101047202 A | 10/2007 |
|----|-------------|---------|
| CN | 101740607 A | 6/2010  |
| JP | 2008-078590 A | 4/2008 |

OTHER PUBLICATIONS

ISR; dated Oct. 17, 2011; PCT/CN2012/080422.
(Continued)

*Primary Examiner* — Matthew Reames
*Assistant Examiner* — John Bodnar
(74) *Attorney, Agent, or Firm* — Ladas & Parry LLP

(57) ABSTRACT

Embodiments of the invention provide an organic light-emitting display (OLED) panel and a manufacturing method for the OLED panel, which comprises providing a substrate comprising a first electrode layer which comprises a plurality of first electrodes spaced apart from each other, forming an insulating layer on the substrate, etching off the insulating layer over the first electrodes by a photolithography process to form a pattern of sub-pixel depositing areas and forming organic light-emitting layers for desired colors within the sub-pixel depositing areas, and forming a second electrode layer on the insulating layer and the organic light-emitting layers. Embodiments of the invention can exactly prepare the organic light-emitting layers to improve yield.

9 Claims, 7 Drawing Sheets

(51) Int. Cl.
*H01L 33/08* (2010.01)
*H01L 27/32* (2006.01)
*H01L 51/00* (2006.01)

(52) U.S. Cl.
CPC .......... *H01L 27/3283* (2013.01); *H01L 33/08* (2013.01); *H01L 51/50* (2013.01); *H01L 51/0081* (2013.01); *H01L 51/0085* (2013.01); *H01L 2227/323* (2013.01); *H01L 2251/308* (2013.01)

(58) Field of Classification Search
CPC .. H01L 27/3244; H01L 27/3281; H05B 33/10
USPC .................................................. 313/503, 506
See application file for complete search history.

(56) References Cited

U.S. PATENT DOCUMENTS

| | | | |
|---|---|---|---|
| 2001/0040663 A1* | 11/2001 | Jun .................. | G02F 1/134363 349/141 |
| 2003/0006699 A1 | 1/2003 | Ogino et al. | |
| 2003/0008071 A1* | 1/2003 | Van Slyke .............. | C23C 14/12 427/255.28 |
| 2003/0015140 A1* | 1/2003 | Van Slyke .............. | C23C 14/12 118/723 VE |
| 2004/0201583 A1* | 10/2004 | Burroughes et al. ......... | 345/211 |
| 2006/0128054 A1* | 6/2006 | Kim et al. ...................... | 438/82 |
| 2007/0222367 A1* | 9/2007 | Hosoda ............... | H01L 27/3213 313/503 |
| 2008/0142797 A1* | 6/2008 | Lee et al. ........................ | 257/43 |
| 2008/0315755 A1* | 12/2008 | Han .................... | H01L 51/5259 313/504 |
| 2009/0184636 A1* | 7/2009 | Cok .................... | H01L 51/5234 313/505 |
| 2010/0117936 A1* | 5/2010 | Lhee ................... | H01L 27/3211 345/76 |

OTHER PUBLICATIONS

International Preliminary Report on Patentability dated Apr. 22, 2014; PCT/CN2012/080422.
First Chinese Office Action dated May 28, 2014; Appln. No. 201110315177.7.

* cited by examiner

ORGANIC LIGHT-EMITTING DISPLAY PANEL AND MANUFACTURING METHOD

TECHNICAL FIELD

Embodiments of the present invention relates to an organic light-emitting display (OLED) panel and a method for fabricating the same.

BACKGROUND

An OLED device are drawing attention increasingly in the display market due to its simple configuration, optimal operation temperature, fast response, vivid color contrast, no limit to view angle and so on.

In the prior art, an organic light-emitting layer of the OLED device is typically formed by directly evaporating an organic light emitting material with a mask on a substrate. Since there are drawbacks of low accuracy of masks, difficulty for aligning, and so on, yield of manufactured OLED devices is relatively low. An organic light-emitting layer with a smaller area cannot be achieved since an evaporation area cannot be accurately controlled, which cannot meet requirements for organic light-emitting display industrialization in rapid development at present.

Therefore, there is an urgent need for a manufacturing method capable of achieving a precisely fabricated organic light-emitting layer so as to improve yield.

SUMMARY

An object of the invention is to provide an OLED panel and its manufacturing method for exactly preparing the organic light-emitting layer so as to improve yield.

One embodiment of the invention provides a manufacturing method of an OLED panel, which comprises providing a substrate comprising a first electrode layer which comprises a plurality of first electrodes spaced apart from each other, forming an insulating layer on the substrate, etching off the insulating layer over the first electrodes by a photolithography process to form a pattern of sub-pixel depositing areas and forming organic light-emitting layers for desired colors at the sub-pixel depositing areas, and forming a second electrode layer on the insulating layer and the organic light-emitting layers.

In an example, etching off the insulating layer over the first electrodes by a photolithography process to form the sub-pixel depositing areas and forming the organic light-emitting layers for desired colors within the sub-pixel depositing areas, and forming the second electrode layer on the insulating layer and the organic light-emitting layers, comprises performing following steps sequentially to the organic light-emitting layers for each color: etching off all of stacked structures over the first electrodes of sub-pixels for the color by a photolithography process to form a pattern comprising a sub-pixel depositing area for the color; depositing the organic emitting light layer for the color; removing the organic emitting light layer for the color that is deposited outside the sub-pixel depositing area for the color; and depositing a layer of material for the second electrode layer.

In an example, a thickness of the organic light-emitting layer for the color deposited within the sub-pixel depositing area for the color is larger than a thickness of the organic emitting light layer for the color that is deposited outside the sub-pixel depositing area for the color.

In an example, removing the organic emitting light layer for the color that is deposited outside the sub-pixel depositing area for the color comprises: completely etching off the organic emitting light layer for the color that is deposited outside the sub-pixel depositing area for the color and partially etching off the organic emitting light layer for the color deposited within the sub-pixel depositing area for the color by controlling an etching speed.

In an example, removing the organic emitting light layer for the color that is deposited outside the sub-pixel depositing area for the color comprises: etching off the organic emitting light layer for the color that is deposited outside the sub-pixel depositing area for the color by a photolithography process.

In an example, etching off the insulating layer over the first electrodes by a photolithography process to form sub-pixel depositing areas and forming organic light-emitting layers for the corresponding colors at the sub-pixel depositing areas comprises: etching off the insulating layer on all of the first electrodes by a photolithography process to form a pattern comprising all of the sub-pixel depositing areas; then performing following steps sequentially to the organic light-emitting layers for each color to finally form organic light-emitting layers for corresponding colors at all of the sub-pixel depositing areas: depositing the organic light-emitting layer for the color; removing the organic emitting light layer for the color that is deposited outside the sub-pixel depositing area for the color by a photolithography process.

In an example, etching off the insulating layer over the first electrodes by a photolithography process to form a pattern comprising all the depositing areas comprises: coating photoresist on the insulating layer; exposing the photoresist to form a photoresist remaining area and a photoresist non-remaining area, wherein the photoresist non-remaining area corresponds to all of the sub-pixel depositing areas and the photoresist remaining area corresponds to areas other than all of the sub-pixel depositing areas; developing the exposed photoresist to remove the photoresist at the photoresist non-remaining area and retain the photoresit at the photoresist remaining area; etching off the insulating layer at the photoresist non-remaining area to form a pattern comprising all of the sub-pixel depositing areas; removing the residual photoresist.

In an example, the desired colors of the organic light-emitting layers comprise red, blue and green. For example, the red organic light-emitting layer comprises a hole transmitting layer, a red light emitting layer and an electron transmitting layer; the blue organic light-emitting layer comprises a hole transmitting layer, a blue light emitting layer and an electron transmitting layer; the green organic light-emitting layer comprises a hole transmitting layer, a green light emitting layer and an electron transmitting layer.

In an example, the first electrode layer is an anode layer and the second electrode layer is a cathode layer, or the second electrode layer is an anode layer and the first electrode layer is a cathode layer.

Another embodiment of the invention provides an OLED panel, which is manufactured by the above method.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiments will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Embodiments of the invention provide a method for manufacturing an OLED panel, which comprises firstly depositing an insulating layer, forming a light emitting area by a photolithography process on the insulating layer, and then evaporating an organic light emitting material to form an organic light-emitting layer. The embodiments of the invention may realize an accurate control on a position of the organic light-emitting layer and improve yield of the resultant products due to employing a photolithography process.

Figure 1:
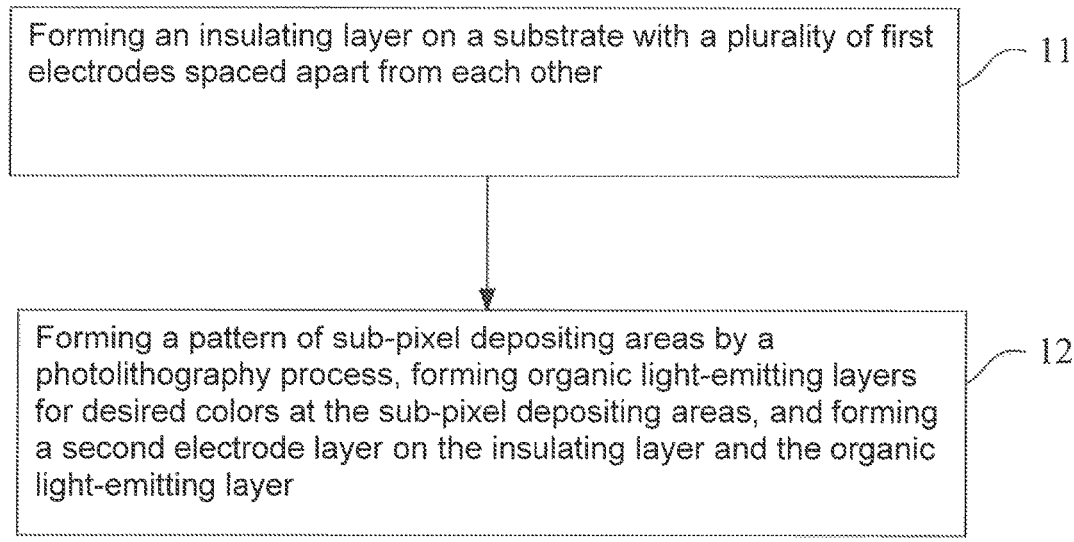
FIG. 1 is a schematic diagram of a method for manufacturing an OLED panel according to an embodiment of the invention.

Firstly, referring to FIG. 1, a method for manufacturing the OLED panel according to an embodiment of the invention comprises the following steps.

Step 11, an insulating layer is formed on a substrate with a first electrode layer formed thereon. The first electrode layer comprises a plurality of first electrodes spaced apart from each other.

Step 12, a pattern of sub-pixel depositing areas is formed by performing a photolithography process to etch off the insulating layer on the first electrodes, organic light-emitting layers for desired colors are formed at the sub-pixel depositing areas, and a second electrode layer is formed on the insulating layer and the organic light-emitting layer.

Each of the first electrodes is for example a transparent conductive layer, and is formed on the substrate corresponding to each sub-pixel, and for example is controlled by a switching element, respectively.

Here, the organic light-emitting layers generally comprise a combination of various colors different from each other, for example a combination of three colors of red, green, blue, but may also comprise other various colors different from each other. The color corresponding to each sub-pixel depositing area is predetermined, for example, colors corresponding to adjacent sub-pixel depositing areas are red, green, blue, red, green, blue, . . . respectively. Thus, sub-pixel depositing areas for three colors of red, green and blue correspond to one pixel. Generally, a red organic light-emitting layer comprises a hole transmitting layer, a red light emitting layer and an electron transmitting layer; a blue organic light-emitting layer comprises a hole transmitting layer, a blue light emitting layer and an electron transmitting layer; and a green organic light-emitting layer comprises a hole transmitting layer, a green light emitting layer and an electron transmitting layer. Here, the first electrode layer is an anode layer and the second electrode layer is a cathode layer, or the first electrode layer is a cathode layer and the second electrode layer is an anode layer.

According to an embodiment of the invention, sub-pixel depositing areas are formed by firstly depositing an insulating layer on a substrate, and then etching off the insulating layer deposited on the first electrodes by a photolithography process. The photolithography process has very high accuracy, and therefore depositing areas having very high accuracy can be achieved so that the organic light-emitting layers formed in the depositing area also have very high accuracy. According to the embodiment of the invention, an organic light-emitting layers which have higher accuracy and occupy smaller areas than that of the prior art can be achieved, and the yield of resultant products can be improved.

The above step 12 can be performed in different manners, which will be explained with specific examples as follows.

As one preferred realization manner, the organic light-emitting layers for each color can be sequentially processed as follows.

Firstly, all of stacked structures over the first electrode corresponding to a desired color are etched off to form a pattern comprising the sub-pixel depositing areas corresponding to this color by a single photolithography process. Here, sub-pixel depositing areas can be formed by employing for example ultraviolet lithography, electron beam exposure, or the like.

Then, the organic light-emitting layer for this color is deposited on the substrate on which is formed the pattern comprising sub-pixel depositing areas corresponding to this color formed by the above photolithography process. The deposition process may be thermal evaporation vaporization, for example.

Next, the organic light-emitting layer for this color deposited outside the sub-pixel depositing areas corresponding to this color is etched off.

Finally, a second electrode layer is deposited on the substrate processed by the above etching process.

The organic light-emitting layer for each color is formed one by one through the above processes, and an OLED panel comprising the organic light-emitting layers for all colors is finally formed.

Figure 2A:
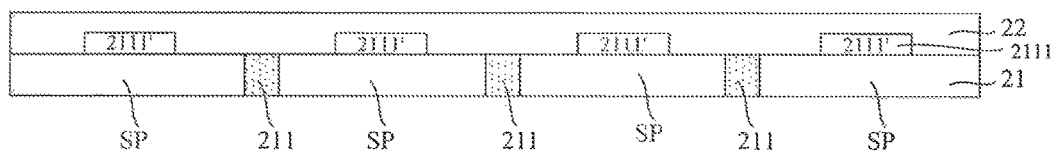
FIGS. 2A to 2P is schematic diagrams of a special example for manufacturing an OLED panel according to an embodiment of the invention.

The above steps are explained in detail by referring to the drawings taking organic light-emitting layers for red, green and blue colors as an example. FIGS. 2A to 2P illustrate a specific example which employs the above steps.

FIG. 2A illustrates a substrate 21 having an insulating layer 22 formed thereon, and the substrate 21 further comprises pixel spacer areas 211 for separating each sub-pixel SP. The first electrode layer 2111 comprising a plurality of first electrodes 2111' is formed on an upper surface of the substrate 21, and each of the first electrodes 2111' corresponds to each sub-pixel SP so as to be separated from other ones, thus a switching element such as a TFT controls whether it is powered on or not. The color displayed by each sub-pixel SP is determined by the color of the light emitted from the organic light-emitting layer. The substrate 21 may be prepared in advance, for example, or may be prepared at a same process as the illustrated method.

Figure 2B:
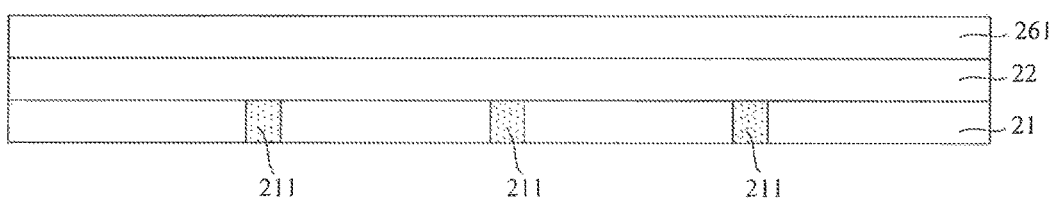
FIG. 2E' is a schematic structural view after depositing an organic light-emitting layer on a substrate according to an embodiment of the invention.
Figure 2C:
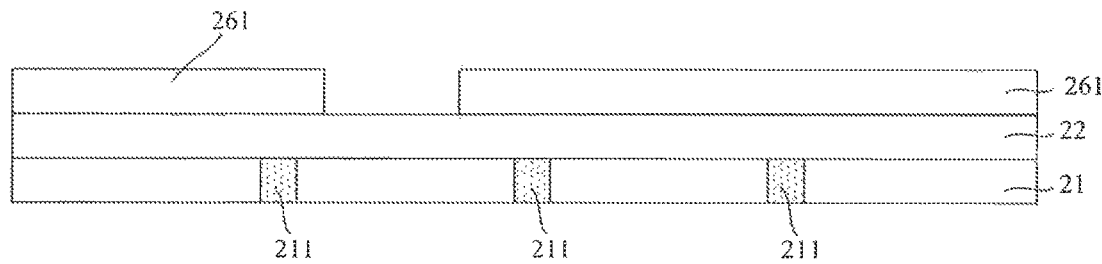
Figure 2D:
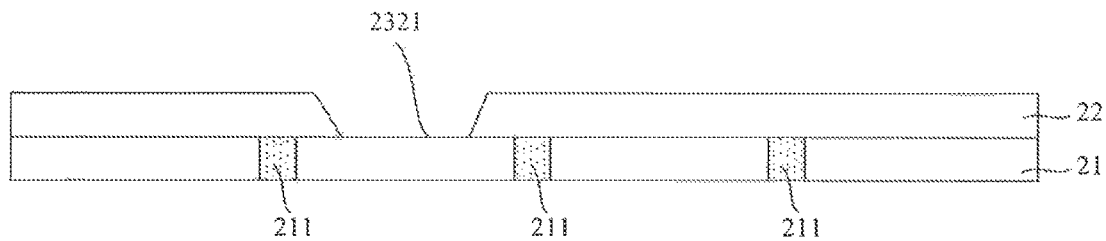
Figure 2D:
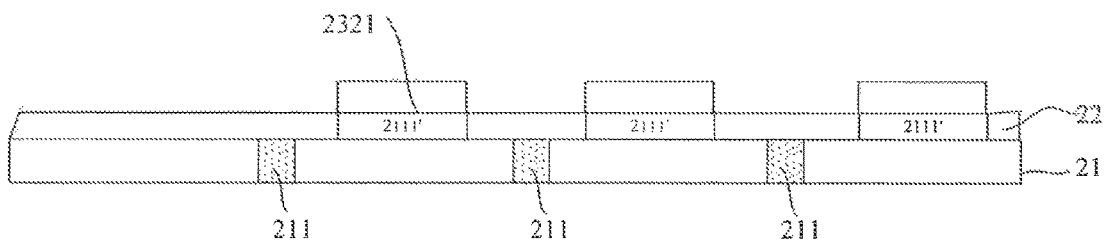

In FIGS. 2B-2D, all of the stacked structures (here comprising only the insulating layer 22) on the first electrode of the sub-pixel corresponding to red color is etched off to form a pattern comprising a sub-pixel depositing area 2321 corresponding to red color by a single photolithographic process. In FIG. 2B, photoresist 261 is coated on the insulating layer 22. In FIG. 2C a photoresist non-remaining area is formed on the first electrode of the sub-pixel corresponding to red color, and a photoresist remaining area is formed on the rest area. In FIG. 2D, the insulating layer on the photoresist non-remaining area is etched off to form a pattern comprising a sub-pixel depositing area 2321 corresponding to red color, and the remaining photoresist is removed. In FIG. 2D', the first electrodes 2111' that are disposed on the upper surface of the substrate 21 between pixel spacer areas 211 and correspond to the sub-pixel depositing areas 2321 are illustrated by way of example for clarity.

Figure 2E:
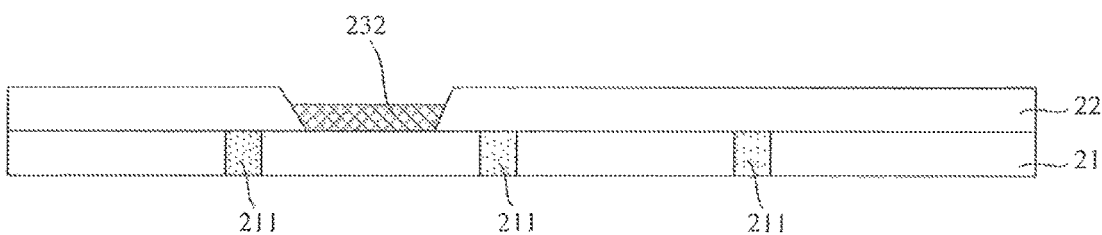

In FIG. 2E, a red organic light-emitting layer (that is, an organic light-emitting layer emitting red light) is deposited on the substrate shown in FIG. 2D, and then the red organic light-emitting layer deposited outside the sub-pixel depositing area 2321 corresponding to red color is etched off to obtain a structure as shown in FIG. 2E, and the red organic light-emitting layer 232 is formed within the sub-pixel depositing area 2321 corresponding to red color in FIG. 2E.

In FIG. 2F, a layer of conductive material is further deposited on the structure shown in FIG. 2E as a second electrode layer 24.

Figure 2G:
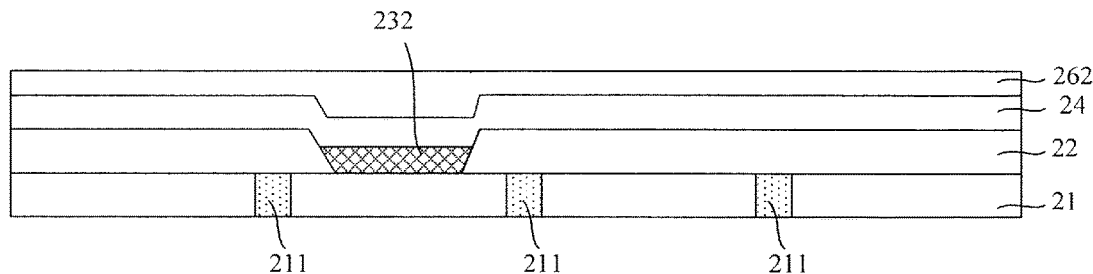
Figure 2H:
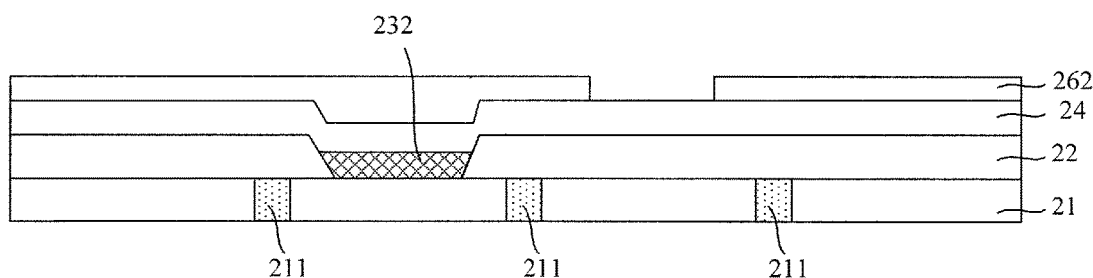
Figure 2I:
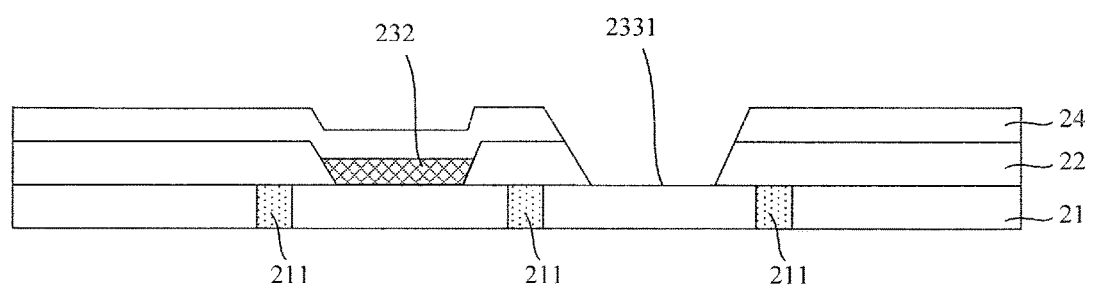

In FIGS. 2G to 2I, all of stacked structures (here comprising the insulating layer 22 and the second electrode layer 24) on the first electrode of the sub-pixel corresponding to blue color is etched off to form a pattern comprising a sub-pixel depositing area 2331 corresponding to blue color by a single photolithography process. In FIG. 2G, photoresist 262 is spin-coated on the structure shown in FIG. 2F. In FIG. 2H, by an exposure and a development process and so on, a photoresist non-remaining area is formed on the first electrode of the sub-pixel corresponding to blue color, and a photoresist remaining area is formed on the rest area. In FIG. 2I, the insulating layer at the photoresist non-remaining area is etched off by an etching process to form a pattern comprising a sub-pixel depositing area 2331 corresponding to blue color, and the remaining photoresist is removed.

Figure 2J:
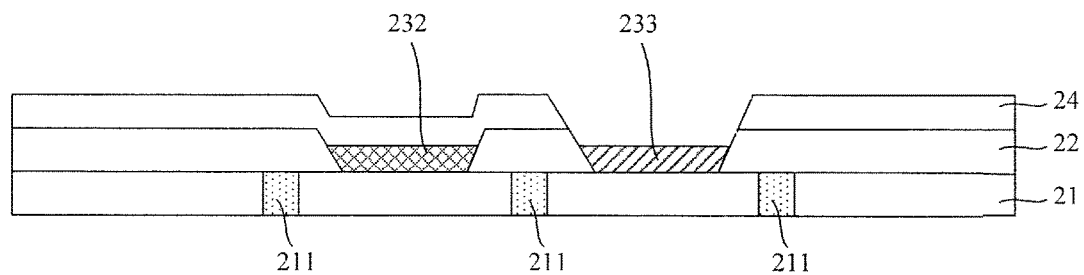

In FIG. 2J, a blue organic light-emitting layer (that is, an organic light-emitting layer emitting blue light) is deposited on the substrate shown in FIG. 2I, and then the blue organic light-emitting layer deposited outside the sub-pixel depositing area 2331 corresponding to blue color is etched off so as to obtain a structure shown in FIG. 2J, and the blue organic light-emitting layer 233 is formed in the sub-pixel depositing area 2331 corresponding to blue color in FIG. 2J.

Figure 2K:
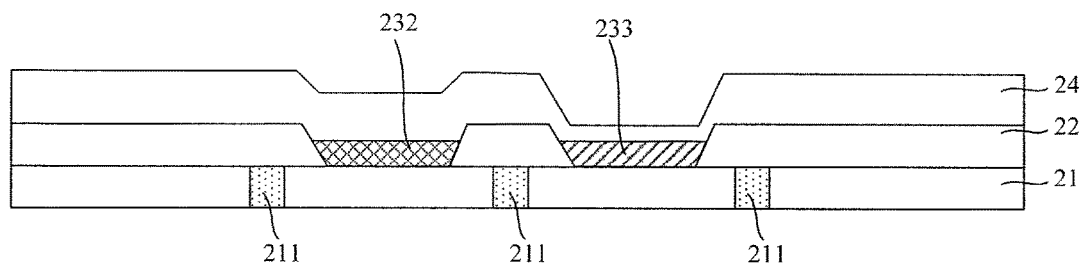

In FIG. 2K, a layer of conductive material is deposited on the structure shown in FIG. 2J as a second electrode layer 24, which is combined with the second electrode layer 24 formed in the previous steps.

Figure 2L:
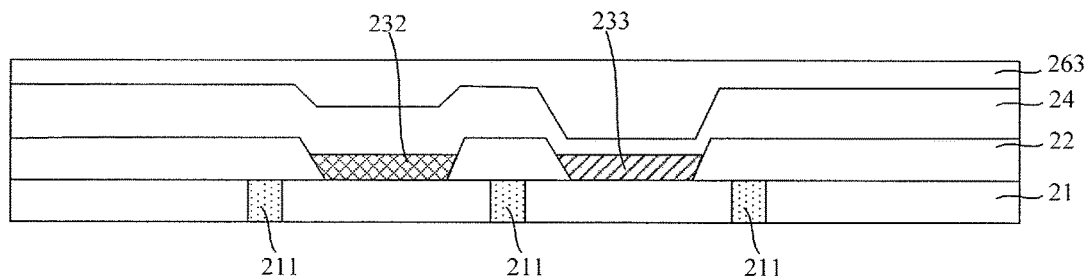
Figure 2M:
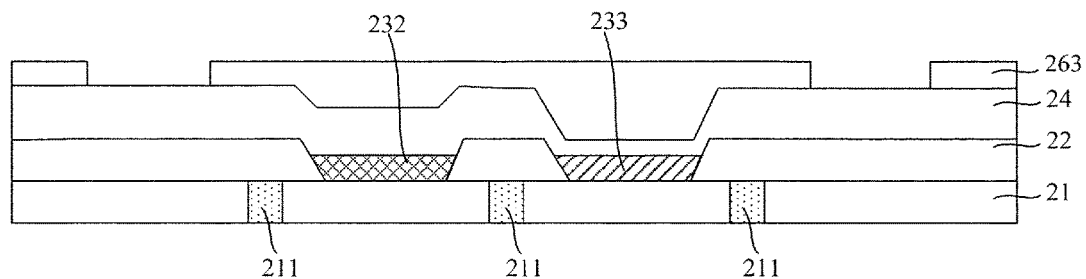
Figure 2N:
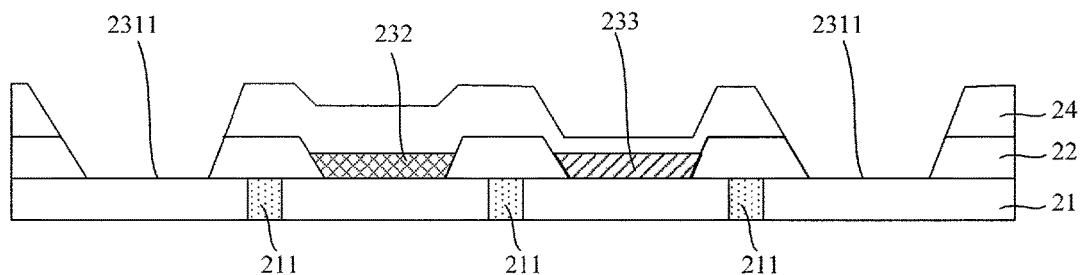

In FIGS. 2L to 2N, all of stacked structures (here comprising the insulating layer 22 and the second electrode layer 24) on a first electrode of the sub-pixel corresponding to green color is etched off to form a pattern comprising a sub-pixel depositing area 2311 corresponding to green color by a single photolithography process. In FIG. 2L, photoresist 263 is spin-coated on the structure shown in FIG. 2K. In FIG. 2M, by an exposure and a development process and so on, a photoresist non-remaining area is formed on the first electrode corresponding to green color, and a photoresist remaining area is formed on the rest area. In FIG. 2N, the insulating layer at the photoresist non-remaining area is etched by an etching process to form a pattern comprising a sub-pixel depositing area 2311 corresponding to green color, and the remaining photoresist is removed.

Figure 2O:
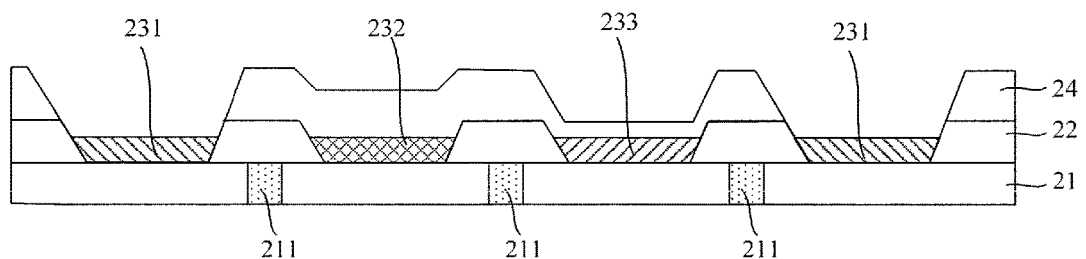
Figure 2P:
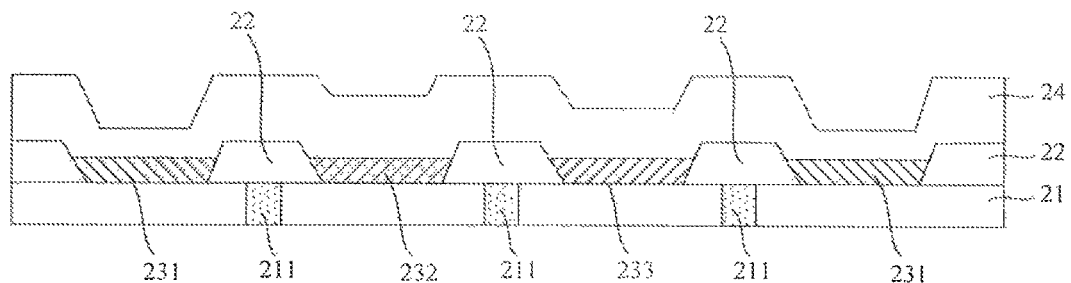
Figure 2E:
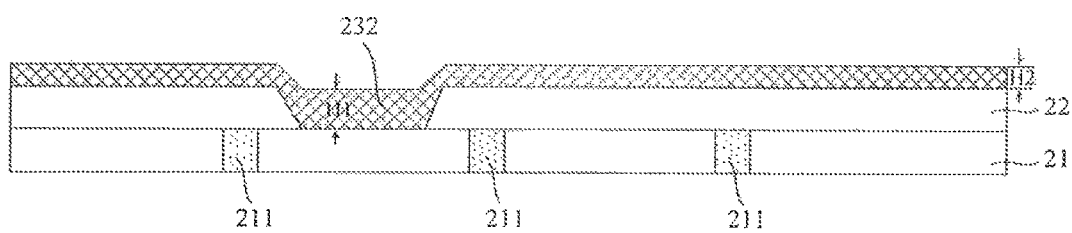

In FIG. 2O, a green organic light-emitting layer (that is, an organic light-emitting layer emitting green light) is deposited on the substrate shown in FIG. 2N, and then the green organic light-emitting layer deposited outside the sub-pixel depositing area 2311 corresponding to green color is etched off so as to obtain a structure as shown in FIG. 2O, and the green organic light-emitting layer 231 is formed in the sub-pixel depositing area 2311 corresponding to green color in FIG. 2O.

In FIG. 2P, finally, a conductive layer is further deposited on the structure shown in FIG. 2O as a second electrode layer 24, which is combined with the second electrode layer 24 formed in the previous processes so as to form an resultant OLED panel, which comprises red, blue and green sub-pixel SP arranged in a certain order.

Organic light-emitting layers for each color are sequentially formed in a blue-green-red order as described above. The present embodiment may also employ other order to faint organic light-emitting layers for all colors, and the invention is not limited thereto.

Examples of the material which may be employed by each layer of the OLED panel shown in FIG. 2P are briefly explained as follows.

The blue organic light-emitting layer 233 for example may have a thickness of 1-200 nm, and may comprise a hole transmitting layer, a blue light emitting layer, an electron transmitting layer, and so on, which are sequentially stacked together. The hole transmitting layer may be formed of an aromatic amine material for example NPB (N, N'-diphenyl-N—N'bi-(1-naphthalenyl)-1,1'diphenyl-4,4'-diamine) or TPD (N,N'-diphenyl-N—N'di-(3-methylphenyl)-1,1'diphenyl-4,4'-diamine), or a macromolecular material. The blue light emitting layer may be formed of a metal complex, a small molecular organic fluorescent material or phosphorescence material and so on, such as FIr (pic) doped in the 4,4'-N,N'-di-carbazolyl-biphenyl (CBP). The electron transmitting layer may be formed of 8-hydroxyquinoline aluminum (AlQ), Bphen or the like.

The pixel spacer area 211 may be formed of an inorganic insulating material such as silicon oxide or silicon nitride, or an organic material.

The green organic light-emitting layer 231 for example may have a thickness of 1-200 nm and may comprise a hole transmitting layer, a green light emitting layer, an electron transmitting layer, and so on which are stacked together. The hole transmitting layer may be formed of an aromatic amine material such as NPB (N,N'-diphenyl-N—N'bi-(1-naphthalenyl)-1,1'diphenyl-4,4'-diamine) or TPD (N,N'-diphenyl-N—N'di-(3-methylphenyl)-1,1'diphenyl-4,4'-diamine), or a macromolecular material. The green light emitting layer may be formed of a metal complex, a small molecular organic fluorescent material or phosphorescence material and so on, such as $(ppy)_2Ir$ (acac) doped in the 4,4'-N,N'-di-carbazolyl-biphenyl (CBP). The electron transmitting layer may be formed of 8-hydroxyquinoline aluminum (AlQ), Bphen or the like.

The red organic light-emitting layer 232 for example may have a thickness of 1-200 nm and may comprise a hole transmitting layer, a red light emitting layer, an electron transmitting layer, and so on which are stacked together. The hole transmitting layer may be formed of aromatic amine material such as NPB (N,N'-diphenyl-N—N'bi-(1-naphthalenyl) -1,1'diphenyl-4,4'-diamine) or TPD (N,N'-diphenyl-N—N'di-(3-methylphenyl)-1,1'diphenyl-4,4'-diamine), or a macromolecular material. The red emitting layer may be formed of a metal complex, a small molecular organic fluorescent material or phosphorescence material or the like, such as rubrene doped in 8-Hydroxyquinoline aluminum (ALQ) or the like. The electron transmitting layer may be formed of 8-Hydroxyquinoline aluminum (ALQ) or Bphen or the like.

As for the anode substrate 21 comprising a structure layer of a driving device such a TFT, the TFT structure is provided between an anode of the device and a glass substrate, the thickness of the TFT structure is 1-1000 nm, for example, and the anode film may be formed of a conductive material with high work function, such as indium tin oxide (ITO), zinc oxide (ZnO) or the like. The driving device may employ a passive driving structure other than TFT, for example. The anode film is electrically connected with and controlled by the driving device such as TFT.

The insulating layer 22 may have a thickness such as 100 nm-1 μm, and can be an insulating film formed of silicon oxide, silicon nitride, SU-8 (epoxy resin adhesive) organic glue, or the like.

The cathode layer 24 may have a thickness of 1-200 nm, for example, and can be formed of a metallic material having low work function such as Al, Mg, Ca, Sa or the like.

In FIGS. 2E, 2J and 2O, since the deposited organic light-emitting layers may cover the whole surface of the substrate after depositing of red/green/blue organic light-emitting layers, the organic light-emitting layers deposited outside the corresponding sub-pixel depositing areas can be etched off so as to obtain the structure shown in FIGS. 2E, 2J and 2O. Here, the above processes may be performed in various different etching manners.

For example, the organic light-emitting layer for the color deposited outside the sub-pixel depositing area corresponding to the color may be further etched off by a photolithography process. That is, first photoresist is spin-coated and then is formed into a photoresist remaining area and a photoresist non-remaining area by an exposing process. The photoresist non-remaining area corresponds to an area other than the sub-pixel depositing area corresponding to the color, and the photoresist remaining area corresponds to the sub-pixel depositing area corresponding to the color. The exposed photoresist is developed so as to remove the photoresist at the photoresist non-remaining area and retain the photoresist at the photoresist remaining area. The organic light-emitting layer for the color at the photoresist non-remaining area is etched off by using the resulting photoresist pattern as an etching mask to obtain a pattern of the organic light-emitting layer. Finally, the residual photoresist is removed. It can be seen that the organic light-emitting layers for each color needs two photolithography processes to be formed.

As another example, referring to FIG. 2E', when the organic light-emitting layer for one color deposited at a sub-pixel depositing area corresponding to this color has a thickness H1 larger than a thickness H2 of the organic light-emitting layer of this color deposited outside the sub-pixel depositing area corresponding to this color, the etching speed can be controlled so that the organic light-emitting layer for this color deposited outside the sub-pixel depositing area corresponding to this color is completely etched off, and the organic light-emitting layer for this color deposited within the sub-pixel depositing area corresponding to this color is partly etched off and partly remains to form a structure shown in FIG. 2E. The organic light-emitting layer for each color formed as described above only needs a single photolithography process to be formed.

The above has explained how to etch off an organic light-emitting layer deposited outside the corresponding sub-pixel depositing area. Since the first electrode (such as an anode) merely contacts with the vaporized organic material at the pixel areas, the other area does not emit light even if an organic material exist there because the organic material does not contact with the first electrode; therefore, in order to simplify processes, it is not necessary for the organic light-emitting layer deposited outside the corresponding sub-pixel depositing area to be removed in the present embodiment. In this example, in the above step 12, the organic light-emitting layers for each color may undergo sequentially the following procedures.

Firstly, all of stacked structures over the first electrode corresponding to this color are etched off to form a pattern comprising a sub-pixel depositing area corresponding to this color by a single photolithography process. Here, the sub-pixel depositing area may be prepared by ultraviolet lithography, electron beam exposure, or the like.

Then, an organic light-emitting layer for this color is deposited on the substrate comprising the pattern of the sub-pixel depositing area corresponding to this color fainted by the above photolithography process, and the specific depositing manner may be thermal evaporation vaporization.

Finally, a conductive material used for a second electrode layer is deposited on the substrate processed by the above etching process.

The organic light-emitting layer for each color is formed one by one through the above processes, and an OLED panel comprising the organic light-emitting layers for all colors can be finally formed.

The two implementation ways of the step 12 according to embodiments of the invention are explained above.

Another preferred implementation way of the above step 12 is provided as follows. In this implementation way, all patterns of the sub-pixel depositing areas are formed by a single photolithography process.

Figure 3A:
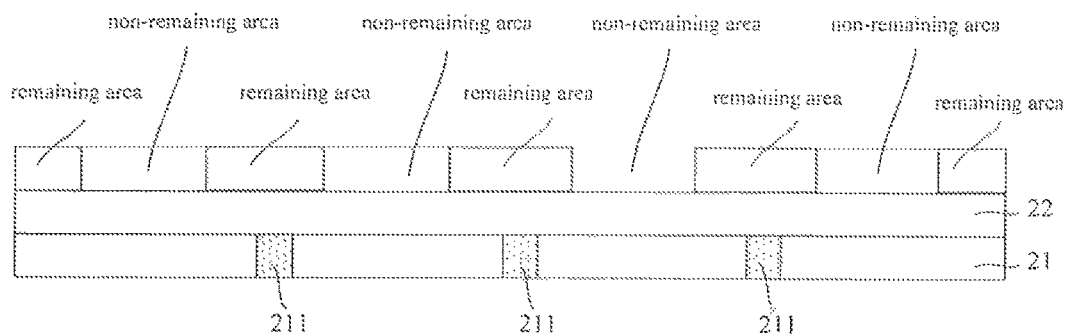
FIGS. 3A to 3C are schematic diagrams of forming a pattern including all of sub-pixel depositing areas by a single photolithography process according to an embodiment of the invention.
Figure 3B:
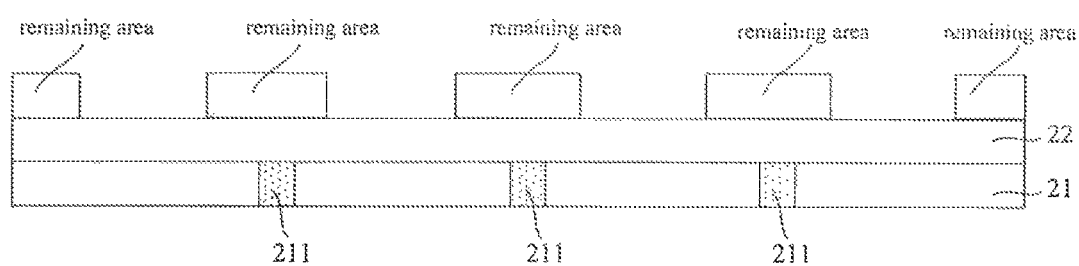
Figure 3C:
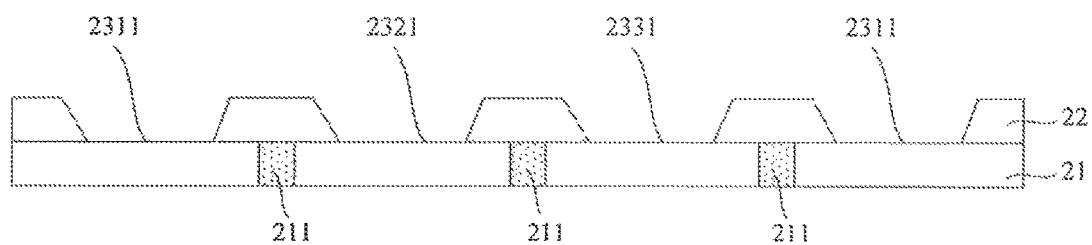

Firstly, all of the insulating layer on the first electrodes is etched off by a single photolithography process to form a pattern comprising all of the sub-pixel depositing areas, as shown in FIGS. 3A to 3C. In particular, a layer of photoresist 26 is coated on the insulating layer 22 as shown in FIG. 3A. The photoresist 26 is exposed to be formed into a photoresist remaining area and a photoresist non-remaining area, wherein the photoresist non-remaining area corresponds to all of the sub-pixel depositing areas, and the photoresist remaining area corresponds to the rest areas other than all of the sub-pixel depositing areas. The photoresist is developed after being exposed so that the photoresist at the photoresist non-remaining area is removed and the photoresist at the photoresist remaining area is retained (as shown in FIG. 3B). Here, the photoresist on all of the first electrodes does not remain, and the photoresist at areas other than the first electrodes remains. The insulating layer at the photoresist non-remaining area is etched off by using the resultant photoresist pattern as an etching mask so as to form a pattern comprising all of the sub-pixel depositing areas 2311, 2321 and 2331. The structure as shown in FIG. 3C is obtained after removing the residual photoresist.

Then, the organic light-emitting layers for each color are sequentially processed as follows to deposit organic light-emitting layers for corresponding colors at all of the sub-pixel depositing areas. The organic light-emitting layer for this color may be deposited in a depositing way such as thermal evaporation vaporization. Next, the organic light-emitting layer for this color deposited outside the sub-pixel depositing area corresponding to this color is etched off by a single photolithography process; for example, photoresist is firstly spin-coated and then exposed so as to form a photoresist remaining area and a photoresist non-remaining area, wherein the photoresist non-remaining area corresponds to the rest area other than the sub-pixel depositing areas corresponding to this color and the photoresist remaining area corresponds to the sub-pixel depositing areas corresponding to this color, and then the photoresist is developed after the exposure to remove the photoresist at the photoresist non-remaining area and remain the photoresist at the photoresist remaining area, the organic light-emitting layer for this color is etched off at the photoresist non-remaining area by using the resultant photoresist pattern as a etching mask, and finally the residual photoresist is removed.

It can be seen that four photolithography processes are needed for forming sub-pixel depositing areas for all colors in this implementation when the organic light-emitting layer comprises red, green and blue colors. After forming of the sub-pixel depositing areas for all colors, a second electrode layer can be deposited on the insulating layer and the organic light-emitting layers to form an OLED panel.

Specific materials which can be employed by each layer structure in the OLED panel according to the embodiment of the invention and the method for forming each layer will be further explained as follows.

In the present embodiment, an anode layer may be formed of a conductive film such as indium tin oxide with resistivity generally of $10^{-4}$ Ωcm-0.1 Ωcm. The insulating layer is an insulating film such as silicon oxide or silicon nitride with a thickness of 5-200 nm, for example. The organic light-emitting layer generally comprises a hole transmitting layer, an emitting layer and an electron transmitting layer and so on, which are sequentially stacked together. The hole transmitting layer may be formed of N,N'-diphenyl-N—N'bi-(1-naphthalenyl)-1,1'diphenyl-4,4'-diamine or N,N'-diphenyl-N—N'di-(3-methylphenyl)-1,1'diphenyl-4,4'-diamine, with a thickness of 1-100 nm, for example. The light emitting layer may be formed of a metal complex (such as 8-hydroxyquinoline aluminum), a small molecular organic fluorescent material (such coumarin dyes 6) or phosphorescence material (such as octaethylporphyrin platinum) and so on with a thickness of 1-100 nm, for example. The above small molecular organic fluorescent material may be a compound such as 8-hydroxyquinoline aluminum (AlQ), coumarin or rubrene and so on to obtain different light emitting wavelengths. The electron transmitting layer may be 8-hydroxyquinoline aluminum or 4,7-Diphenyl-1,10-phenanthroline (phen) with a thickness of 30-70 nm, for example. The cathode layer may formed of a metal having low work function such Al, Ca or Mg, or any alloy of the above with a noble metal such as Ag since the lower work function may be helpful for electrons injecting from cathode to the electron transmitting layer, and its thickness is generally 5-50 nm, for example.

If necessary, the above organic electroluminescence device may also comprises:

an electron injection/controlling layer, which may be formed of fluoride (such as lithium fluoride), cesium carbonate or the like, may have a thickness of 1-15 nm, and may be formed by thermal evaporation vaporization; and a hole injection/controlling layer, which may be formed by using CuPc (phthalocyanine copper, which is an organic materials), $V_2O_5$ (vanadic oxide, an inorganic material), and may be formed through thermal evaporation vaporization.

The organic layers of the pixel areas of the OLED panel provided in an embodiment of the invention are deposited in a different manner from that in the prior art. In the prior art, the organic light-emitting layers for three primary colors of red, green and blue in pixel areas are deposited by using different evaporation masks, but according to the embodiment of the invention are formed by forming depositing areas of the organic layers for the three primary colors through a photolithography process and sequentially depositing organic layers for the three primary colors of red, green and blue for all the depositing areas.

The stacked structures and the forming methods according to an embodiment of the invention is explained by referring to the following three special examples, and these examples are only used to further explain the material and steps that may be employed by the embodiment of the invention, not to limit the invention.

EXAMPLE 1

An OLED Panel Employing Silicon Nitride as an Insulating Layer

Cleaning an indium tin oxide anode film on a substrate comprising a TFT structure;

Depositing an insulating layer formed of silicon nitride by using a plasma enhanced chemical vapor deposition (PECVD) to a thickness of 200 nm;

Spin-coating photoresist on the insulating layer to a thickness of 1-3 micrometer, and developing the photoresist with a spraying manner for 5-120 second after an exposure process;

Dry-etching the insulating layer formed of the silicon nitride by a reactive plasma (RIE) process with etching gases of $SF_6$ and $O_2$ for 200 second; and Removing the residual photoresist by using an organic washing liquid and then drying with an air knife way.

Thereafter, the organic material and metallic cathode are formed by thermal evaporation in an organic/metallic film depositing high vacuum system, which particularly comprises sequentially forming by thermal evaporation the hole transmitting layer (about 170° C.), the light emitting layer (about 180° C.), the electron transmitting layer (about 190° C.) and the cathode layer (about 900° C.) at vacuum pressure of $1 \times 10^{-4}$ Pa. The hole transmitting layer is formed of NPB (N,N'-diphenyl-N—N'bi-(1-naphthalenyl)-1,1' diphenyl-4,4'-diamine) with a thickness of about 30-70 nm, the blue light emitting layer is formed of Fir(Pic) doped in 4,4'-N,N'-di-carbazolyl-biphenyl (CBP) with a thickness of 10-30 nm, the green light emitting layer is formed of 8-hydroxyquinoline aluminum (AlQ) with a thickness of 10-30 nm, and the red light emitting layer is formed of rubrene doped in 8-hydroxyquinoline aluminum (AlQ) with a thickness of 10-30 nm, the electron transmitting layer is formed of 8-hydroxyquinoline aluminum (AlQ) with a thickness of 30-70 nm, and the cathode layer is formed of LiF/Al layer in 1-500 nm thick.

The panel is a bottom-emitting type, that is, light emits from the substrate.

EXAMPLE 2

An OLED Panel Using Sm/Ag as a Thick Cathode Layer

Cleaning an indium tin oxide anode film on a substrate comprising a TFT structure;

Depositing an insulating layer formed of silicon oxide by using a plasma enhanced chemical vapor deposition (PECVD) to a thickness of 200 nm;

Coating photoresist on the insulating layer by a spin-coating process to a thickness of 1-3 micrometer, and developing the photoresist with a spraying manner for 5-120 second after an exposure process;

Wet-etching the silicon oxide with 1% HF acid as an etching solution for 50 second; and Removing the residual photoresist by using organic washing liquid and then drying with an air knife way.

Thereafter, the organic material and metallic cathode is formed by thermal evaporation in an organic/metallic film depositing high vacuum system. One way is comprises: sequentially forming by thermal evaporation the hole transmitting layer (about 170° C.), the light emitting layer (about 180° C.), the electron transmitting layer (about 190° C.) and the cathode layer (about 900° C.) at vacuum pressure of $1 \times 10^{-4}$ Pa. The hole transmitting layer is formed of NPB (N,N'-diphenyl-N—N'bi-(1-naphthalenyl)-1,1'diphenyl-4,4'-diamine) with a thickness of about 30-70 nm, the blue light emitting layer is formed of Fir(Pic) doped in 4,4'-N,N'-di-carbazolyl-biphenyl (CBP) with a thickness of 10-30 nm, the green light emitting layer is formed of 8-hydroxyquinoline aluminum (AlQ) with a thickness of 10-30 nm, and the red light emitting layer is formed of rubrene doped in 8-hydroxyquinoline aluminum (AlQ) with a thickness of 10-30 nm, the electron transmitting layer is formed of $(ppy)_2Ir(acac)$ doped in CBP with a thickness of 30-70 nm, and the cathode layer is formed of a Sm/Ag layer with a thickness of 100 nm.

The panel is in a bottom-emitting type.

EXAMPLE 3

An OLED Panel Using Zinc Oxide as an Anode

Cleaning a zinc oxide anode film on a substrate comprising a TFT structure;

Depositing an insulating layer formed of silicon nitride by using a plasma enhanced chemical vapor deposition equipment (PECVD) to a thickness of 200 nm;

Coating photoresist by a spin-coating process to a thickness of 1-3 micrometer, and developing the photoresist with a spraying manner for 5-120 second after an exposure process;

Dry-etching the silicon nitride by a reactive plasma (RIE) process with etching gases of $SF_6$ and $O_2$ for 200 second;

Removing the residual photoresist by using organic washing liquid and then drying with an air knife way.

Thereafter, the organic material and metallic cathode are formed by thermal evaporation in an organic/metallic film depositing high vacuum system, and one way comprises sequentially forming by thermal evaporation the hole transmitting layer (about 170° C.), the light emitting layer (about 180° C.), the electron transmitting layer (about 190° C.) and the cathode layer (about 900° C.) at vacuum pressure of $1 \times 10^{-4}$ Pa. The hole transmitting layer is formed of NPB (N,N'-diphenyl-N—N'bi-(1-naphthalenyl)-1,1' diphenyl-4,4'-diamine) with a thickness of about 30-70 nm, the blue light emitting layer is formed of Fir(Pic) doped in 4,4'-N,N'-di-carbazolyl-biphenyl (CBP) with a thickness of 10-30 nm, the green light emitting layer is formed of 8-hydroxyquinoline aluminum (AlQ) with a thickness of 10-30 nm, and the red light emitting layer is formed of rubrene doped in 8-hydroxyquinoline aluminum (AlQ) with a thickness of 10-30 nm, the electron transmitting layer is formed of Bphen with a thickness of about 30-70 nm, and the cathode layer is formed of a $Yb/Au/SnO_2$ layer with a thickness of 100 nm.

The display panel is in a top-emitting type, that is, light emits from a direction opposite to the substrate.

In conclusion, an OLED panel is provided in an embodiment of the invention, and this OLED panel is manufactured by any of the methods disclosed in the above-described embodiments, and the details are omitted here.

In addition, an OLED device comprising the above OLED panel is provided in an embodiment of the invention.

The invention claimed is:

1. A method of manufacturing an organic light-emitting display (OLEO) panel, comprising:
    providing a substrate comprising a first electrode layer which is formed on a surface of the substrate and which comprises a plurality of first electrodes spaced apart from each other, wherein the substrate further comprises sub-pixel regions and sub-pixel spacer regions, the sub-pixel spacer region is formed in the substrate for separating the sub-pixel regions and is made of an organic material different from a material of the substrate, and wherein each of the first electrodes is disposed above the sub-pixel spacer regions and between adjacent sub-pixel spacer regions such that it has no overlapped area with the sub-pixel spacer regions in both vertical direction and horizontal direction;
    forming an insulating layer on the substrate;
    etching off the insulating layer directly over the first electrodes by a first photolithography process to form patterns corresponding to respective sub-pixel depositing areas and forming organic light-emitting layers within the sub-pixel depositing areas, wherein the sub-pixel depositing areas comprise red, green and blue sub-pixel depositing areas, and colors of the organic light-emitting layer formed within the respective red, green and blue sub-pixel depositing areas is red, green and blue; and
    forming a second electrode layer on both the insulating layer and the organic light-emitting layers;
    wherein etching off the insulating layer directly over the first electrodes by a first photolithography process to form sub-pixel depositing areas and forming the organic light-emitting layers within the sub-pixel depositing areas comprises:
    etching off the insulating layer on each and every of the first electrodes by a first photolithography process to simultaneously form patterns matching with respective sub-pixel depositing areas in size and shape;
    depositing an organic light-emitting layer of the one of red, green and blue above an entire surface of the substrate by a thermal evaporation vaporization process; and
    removing the organic light-emitting layer that is deposited outside the one of red, green and blue sub-pixel depositing areas by a second photolithography process; and
    wherein the step of forming a second electrode layer is performed for each of the organic light-emitting layers.

2. The method of claim 1, wherein the steps of forming organic light-emitting layers within the sub-pixel depositing areas and forming a second electrode layer on both the insulating layer and the organic light-emitting layers comprises:
    depositing a red organic light-emitting layer over an entire surface of the substrate;
    removing the red organic light-emitting layer that is deposited outside the red sub-pixel depositing area;

depositing a first portion of the second electrode layer over the entire surface of the substrate having the red organic light-emitting layer formed thereon;

depositing a blue organic light-emitting layer over an entire surface of the substrate;

removing the blue organic light-emitting layer that is deposited outside the blue sub-pixel depositing area;

depositing a second portion of the second electrode layer over the entire surface of the substrate having the blue organic light-emitting layer formed thereon;

depositing a green organic light-emitting layer over an entire surface of the substrate;

removing the green organic light-emitting layer that is deposited outside the green sub-pixel depositing area;

depositing a third portion of the second electrode layer over the entire surface of the substrate having the green organic light-emitting layer formed thereon.

3. The method of claim 1, wherein the step of removing the organic light-emitting layer that is deposited outside one of red, green and blue sub-pixel depositing areas comprises:

completely etching off the organic light-emitting layer that is deposited outside the one of red, green and blue sub-pixel depositing areas by controlling an etching speed and partially etching off the organic light-emitting layer deposited within the one of red, green and blue sub-pixel depositing areas.

4. The method of claim 1, wherein removing the organic light-emitting layer that is deposited outside the one of red, green and blue sub-pixel depositing area comprises:

etching off the organic light-emitting layer that is deposited outside the one of red, green and blue sub-pixel depositing areas by the second photolithography process.

5. The method of claim 1, wherein etching off the insulating layer on all of the first electrodes by a first photolithography process to form a pattern comprising all of the sub-pixel depositing areas comprises:

coating a layer of photoresist on the insulating layer;

exposing the photoresist to form a photoresist remaining area and a photoresist non-remaining area, wherein the photoresist non-remaining area corresponds to all of the sub-pixel depositing areas and the photoresist remaining area corresponds to areas other than all of the sub-pixel depositing areas;

developing the exposed photoresist to remove the photoresist at the photoresist non-remaining area and retain the photoresist at the photoresist remaining area;

etching off the insulating layer at the photoresist non-remaining area to form a pattern comprising all of the sub-pixel depositing areas; and removing residual photoresist.

6. The method of claim 1, wherein, the red organic light-emitting layer comprises a hole transmitting layer, a red light emitting layer and an electron transmitting layer;

the blue organic light-emitting layer comprises a hole transmitting layer, a blue light emitting layer and an electron transmitting layer; and the green organic light-emitting layer comprises a hole transmitting layer, a green light emitting layer and an electron transmitting layer.

7. The method of claim 1, wherein the first electrode layer is an anode layer, and the second electrode layer is a cathode layer.

8. The method of claim 1, wherein the second electrode layer is an anode layer, and the first electrode layer is a cathode layer.

9. An organic light-emitting display (OLED) panel, wherein the OLED panel is manufactured by the method of claim 1.

* * * * *